(12) United States Patent
Simmons et al.

(10) Patent No.: US 7,865,156 B2
(45) Date of Patent: Jan. 4, 2011

(54) SCANNING METHODS AND APPARATUS WHICH UTILIZE A CARRIER SIGNAL BANDWIDTH TEST

(75) Inventors: Sean B. Simmons, Waterloo (CA); Huan Wu, Kanata (CA); Zoltan Kemenczy, Mississaugua (CA)

(73) Assignee: Research In Motion Limited, Waterloo, Ontario (CA)

( * ) Notice: Subject to any disclaimer, the term of this patent is extended or adjusted under 35 U.S.C. 154(b) by 1286 days.

(21) Appl. No.: 11/414,404

(22) Filed: Apr. 28, 2006

(65) Prior Publication Data

US 2007/0254612 A1    Nov. 1, 2007

(51) Int. Cl.
H04B 1/18 (2006.01)
(52) U.S. Cl. .............. 455/166.2; 455/179.1; 455/184.1; 455/185.1
(58) Field of Classification Search ................ 455/66.1, 455/67.11, 132–136, 179.1–191.3, 161.1, 455/161.2, 161.3, 164.1, 164.2, 166.1, 166.2, 455/177.1
See application file for complete search history.

(56) References Cited

U.S. PATENT DOCUMENTS

| | | | | |
|---|---|---|---|---|
| 5,574,995 | A * | 11/1996 | Masaki | 455/161.2 |
| 5,806,002 | A * | 9/1998 | Wiatrowski et al. | 455/512 |
| 6,122,327 | A * | 9/2000 | Watanabe et al. | 375/316 |
| 6,205,334 | B1 * | 3/2001 | Dent | 455/434 |
| 6,434,186 | B2 * | 8/2002 | Dowling | 375/147 |
| 6,487,399 | B1 * | 11/2002 | Rajaniemi et al. | 455/226.1 |
| 6,687,509 | B2 | 2/2004 | Schmutz et al. | |
| 6,690,746 | B1 * | 2/2004 | Sills et al. | 375/316 |
| 6,816,715 | B1 * | 11/2004 | Mano | 455/161.3 |
| 6,829,471 | B2 * | 12/2004 | White et al. | 455/194.2 |

(Continued)

FOREIGN PATENT DOCUMENTS

CA    2242000    2/1999

(Continued)

OTHER PUBLICATIONS

International Preliminary Report on Patentability, PCT/CA2007/000633, Jun. 9, 2008.

(Continued)

*Primary Examiner*—Edward Urban
*Assistant Examiner*—RuiMeng Hu
(74) *Attorney, Agent, or Firm*—John J. Oskorep, Esq.

(57) ABSTRACT

One illustrative method of scanning a radio frequency (RF) band (e.g. 850 MHz band) for valid RF carrier signals of a wireless communication network (e.g. a GSM network) includes the steps of monitoring an RF channel to receive a candidate RF carrier signal; identifying whether the candidate RF carrier signal is a valid RF carrier signal of the wireless communication network by estimating a bandwidth of the candidate RF carrier signal and, if the estimated bandwidth is different from a predetermined bandwidth associated with valid RF carrier signals of the wireless communication network, identifying that the candidate RF signal is not a valid RF carrier signal of the wireless communication network; and repeating the acts of monitoring and identifying for a next RF channel of a plurality of RF channels associated with the wireless communication network. Preferably, the RF bandwidth estimation is performed together with a system signal detection process (e.g. FCCH detection). Advantageously, the time required to scan the RF band is reduced.

27 Claims, 11 Drawing Sheets

U.S. PATENT DOCUMENTS

| | | | |
|---|---|---|---|
| 6,904,269 B1 * | 6/2005 | Deshpande et al. | 455/142 |
| 7,024,191 B2 * | 4/2006 | Ofuji et al. | 455/432.1 |
| 7,174,145 B2 * | 2/2007 | Chatelier et al. | 455/277.1 |
| 2001/0055328 A1 * | 12/2001 | Dowling | 375/130 |
| 2003/0161411 A1 * | 8/2003 | McCorkle et al. | 375/295 |
| 2005/0227625 A1 * | 10/2005 | Diener | 455/67.7 |
| 2007/0274477 A1 | 11/2007 | Chen | |

FOREIGN PATENT DOCUMENTS

| | | |
|---|---|---|
| EP | 0788263 A2 | 8/1997 |
| EP | 0948226 A2 | 3/1999 |
| EP | 0948226 A2 | 10/1999 |
| EP | 1283608 A2 | 2/2003 |
| EP | 1641293 A1 | 8/2005 |
| GB | 2409610 A | 6/2005 |
| WO | 0031998 A1 | 6/2000 |

OTHER PUBLICATIONS

International Search Report & Written Opinion for Application#—PCT/CA2007/000633—Dated Jul. 5, 2007.

Extended European Search Report, EP application No. 07719560.0, Oct. 29, 2009.

* cited by examiner

US 7,865,156 B2

SCANNING METHODS AND APPARATUS WHICH UTILIZE A CARRIER SIGNAL BANDWIDTH TEST

BACKGROUND

1. Field of the Technology

The present invention relates generally to mobile stations operating in wireless communication networks, and more particularly to mobile station scanning methods and apparatus which utilize a carrier signal bandwidth test.

2. Description of the Related Art

A mobile communication device, such as a mobile station operating in a wireless communication network, may provide for both voice telephony and packet data communications. A mobile station may, for example, be compatible with $3^{rd}$ Generation (3G) communication standards (such as IS-2000 Release 0) and utilize Global System for Mobile Communications (GSM), Time Division Multiple Access (TDMA), or Code Division Multiple Access (CDMA) wireless network technologies.

All of these communication system technologies utilize radio frequency (RF) signal detection techniques. GSM-based systems operate in the 850 Megahertz (MHz) band (869.2-893.8 MHz) in North America, Central America and some countries in South America. In a given region, other communications systems such as paging, digital advanced mobile phone system (DAMPS), and Mobitex systems, may also occupy bandwidth in the 850 MHz band. In this RF band, the assigned channels for GSM-based systems in each geographical region are different from those of its neighboring region and usually different than those of most nearby regions.

In an RF receiver, a scanning process exists for the purpose of detecting each RF carrier signal in the RF band and decoding channel information over the control channels of the networks associated with the RF carrier signals. The scanning process obtains channel information from the base station's signal, and then adds the channel information, along with the RF carrier information, to a channel list for a particular region. The construction of a channel list occurs whenever a mobile station exits one region and enters another region, or when the mobile station is powered on.

In GSM-based systems, information that is detected over the control channel during the scanning process includes a frequency correction channel (FCCH) burst or signal. The FCCH signal is a frequency correction signal which provides a GSM mobile station with a frequency reference in order to synchronize with the GSM network. Although non-GSM base stations transmit RF carrier signals on RF channels of the "GSM band," non-GSM base stations do not broadcast any FCCH burst. Note that the non-GSM RF signals may in fact be considered top GSM candidate signals during scanning, as they may have been observed to be stronger than GSM RF carrier signals. In any case, a GSM mobile station will ultimately reject the non-GSM RF signal and refrain from including the RF channel in the channel list.

However, the FCCH detector requires at least eleven (11) frames (50.8 milliseconds) to reject the non-GSM RF signal due to the recurrence of frequency correction burst information. This is a relatively long time. Per GSM-based standards, a GSM system must be acquired within five (5) seconds. This may be difficult to consistently achieve in the 850 MHz band unless some special scanning techniques are utilized.

Accordingly, what are needed are methods and apparatus for quickly scanning an RF band so as to overcome the deficiencies in the prior art.

BRIEF DESCRIPTION OF THE DRAWINGS

Embodiments of present invention will now be described by way of example with reference to attached figures, wherein.

DETAILED DESCRIPTION OF THE PREFERRED EMBODIMENTS

One illustrative method of scanning a radio frequency (RF) band (e.g. the 850 MHz band) for valid RF carrier signals of a wireless communication network (e.g. a GSM network) includes the steps of monitoring an RF channel to receive a candidate RF carrier signal; identifying whether the candidate RF carrier signal is a valid RF carrier signal of the wireless communication network by estimating a bandwidth of the candidate RF carrier signal and, if the estimated bandwidth is different from. a predetermined bandwidth associated with valid RF carrier signals of the wireless communication network, identifying that the candidate RF signal is not a valid RF carrier signal of the wireless communication network; and repeating the acts of monitoring and identifying for a next RF channel of a plurality of RF channels associated with the wireless communication network. Preferably, the RF bandwidth estimating is performed together with a system signal detection process (e.g. frequency control channel (FCCH) detection). Advantageously, the time required to scan the RF band is reduced.

Figure 1:
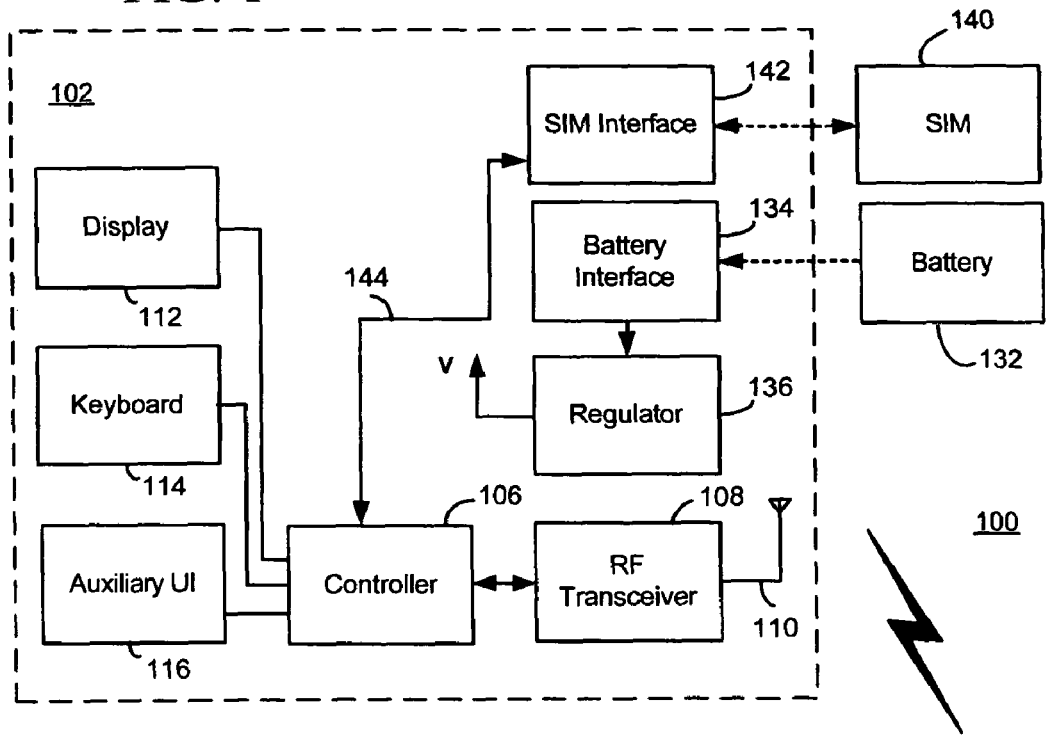
FIG. 1 is a block diagram which illustrates pertinent components of a mobile station and a wireless communication network.
Figure 1:
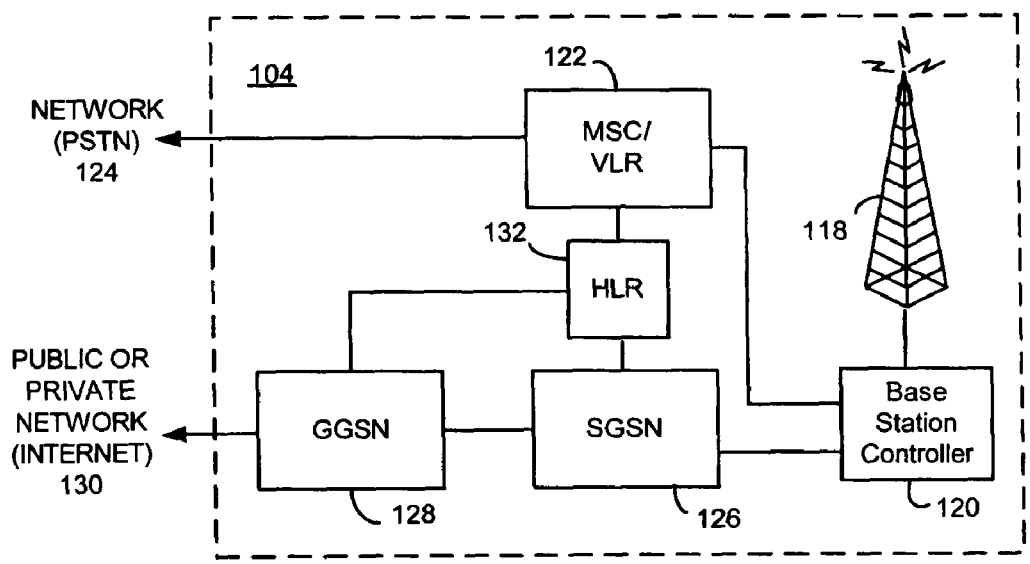

FIG. 1 is a block diagram of a communication system 100 which includes a mobile station 102 (one type of wireless or mobile communication device) which communicates through a wireless communication network 104. Mobile station 102 preferably includes a visual display 112, a keyboard 114, and perhaps one or more auxiliary user interfaces (UI) 116, each of which are coupled to a controller 106. Controller 106 is also coupled to radio frequency (RF) transceiver circuitry 108 and an antenna 110. Typically, controller 106 is embodied as a central processing unit (CPU) which runs operating system software in a memory component (not shown). Controller 106 will normally control overall operation of mobile station 102, whereas signal processing operations associated with communication functions are typically performed in RF transceiver circuitry 108. Controller 106 interfaces with device display 112 to display received information, stored information, user inputs, and the like. Keyboard 114, which may be a telephone type keypad or full alphanumeric keyboard, is normally provided for entering data for storage in mobile station 102, information for transmission to network 104, a telephone number to place a telephone call, commands to be executed on mobile station 102, and possibly other or different user inputs.

Mobile station 102 sends communication signals to and receives communication signals from network 104 over a wireless link via antenna 110. RF transceiver circuitry 108 performs functions similar to those of station 118 and BSC 120, including for example modulation/demodulation and possibly encoding/decoding and encryption/decryption. It is also contemplated that RF transceiver circuitry 108 may perform certain functions in addition to those performed by BSC 120. It will be apparent to those skilled in art that RF transceiver circuitry 108 will be adapted to particular wireless network or networks in which mobile station 102 is intended to operate.

Mobile station 102 includes a battery interface 134 for receiving one or more rechargeable batteries 132. Battery 132 provides electrical power to electrical circuitry in mobile station 102, and battery interface 132 provides for a mechanical and electrical connection for battery 132. Battery interface 132 is coupled to a regulator 136 which regulates power to the device. When mobile station 102 is fully operational, an RF transmitter of RF transceiver circuitry 108 is typically keyed or turned on only when it is sending to network, and is otherwise turned off to conserve resources. Similarly, an RF receiver of RF transceiver circuitry 108 is typically periodically turned off to conserve power until it is needed to receive signals or information (if at all) during designated time periods.

Mobile station 102 operates using a Subscriber Identity Module (SIM) 140 which is connected to or inserted in mobile station 102 at a SIM interface 142. SIM 140 is one type of a conventional "smart card" used to identify an end user (or subscriber) of mobile station 102 and to personalize the device, among other things. Without SIM 140, the mobile station terminal is not fully operational for communication through wireless network 104. By inserting SIM 140 into mobile station 102, an end user can have access to any and all of his/her subscribed services. SIM 140 generally includes a processor and memory for storing information. Since SIM 140 is coupled to SIM interface 142, it is coupled to controller 106 through communication lines 144. In order to identify the subscriber, SIM 140 contains some user parameters such as an International Mobile Subscriber Identity (IMSI). An advantage of using SIM 140 is that end users are not necessarily bound by any single physical mobile station. SIM 140 may store additional user information for the mobile station as well, including datebook (or calendar) information and recent call information.

Mobile station 102 may consist of a single unit, such as a data communication device, a cellular telephone, a multiple-function communication device with data and voice communication capabilities, a personal digital assistant (PDA) enabled for wireless communication, or a computer incorporating an internal modem. Alternatively, mobile station 102 may be a multiple-module unit comprising a plurality of separate components, including but in no way limited to a computer or other device connected to a wireless modem. In particular, for example, in the mobile station block diagram of FIG. 1, RF transceiver circuitry 108 and antenna 110 may be implemented as a radio modem unit that may be inserted into a port on a laptop computer. In this case, the laptop computer would include display 112, keyboard 114, one or more auxiliary UIs 116, and controller 106 embodied as the computer's CPU. It is also contemplated that a computer or other equipment not normally capable of wireless communication may be adapted to connect to and effectively assume control of RF transceiver circuitry 108 and antenna 110 of a single-unit device such as one of those described above. Such a mobile station 102 may have a more particular implementation as described later in relation to mobile station 402 of FIG. 2.

Mobile station 102 communicates in and through wireless communication network 104. Wireless communication network 104 may be a cellular telecommunications network. In the embodiment of FIG. 1, wireless network 104 is configured in accordance with General Packet Radio Service (GPRS) and a Global Systems for Mobile (GSM) technologies. Wireless network 104 includes a base station controller (BSC) 120 with an associated tower station 118, a Mobile Switching Center (MSC) 122, a Home Location Register (HLR) 132, a Serving General Packet Radio Service (GPRS) Support Node (SGSN) 126, and a Gateway GPRS Support Node (GGSN) 128. MSC 122 is coupled to BSC 120 and to a landline network, such as a Public Switched Telephone Network (PSTN) 124. SGSN 126 is coupled to BSC 120 and to GGSN 128, which is in turn coupled to a public or private data network 130 (such as the Internet). HLR 132 is coupled to MSC 122, SGSN 126, and GGSN 128.

Station 118 is a fixed transceiver station, and station 118 and BSC 120 may be referred to as transceiver equipment. The transceiver equipment provides wireless network coverage for a particular coverage area commonly referred to as a "cell". The transceiver equipment transmits communication signals to and receives communication signals from mobile stations within its cell via station 118. The transceiver equipment normally performs such functions as modulation and possibly encoding and/or encryption of signals to be transmitted to the mobile station in accordance with particular, usually predetermined, communication protocols and parameters, under control of its controller. The transceiver equipment similarly demodulates and possibly decodes and decrypts, if necessary, any communication signals received from mobile station 102 within its cell. Communication protocols and parameters may vary between different networks. For example, one network may employ a different modulation scheme and operate at different frequencies than other networks.

The wireless link shown in communication system 100 of FIG. 1 represents one or more different channels, typically different radio frequency (RF) channels, and associated protocols used between wireless network 104 and mobile station 102. An RF channel is a limited resource that must be conserved, typically due to limits in overall bandwidth and a limited battery power of mobile station 102. Those skilled in art will appreciate that a wireless network in actual practice may include hundreds of cells, each served by a station 118 (i.e. or station sector), depending upon desired overall expanse of network coverage. All pertinent components may be connected by multiple switches and routers (not shown), controlled by multiple network controllers.

For all mobile station's 102 registered with a network operator, permanent data (such as mobile station 102 user's profile) as well as temporary data (such as mobile station's 102 current location) are stored in HLR 132. In case of a voice call to mobile station 102, HLR 132 is queried to determine the current location of mobile station 102. A Visitor Location Register (VLR) of MSC 122 is responsible for a group of location areas and stores the data of those mobile stations that are currently in its area of responsibility. This includes parts of the permanent mobile station data that have been transmitted from HLR 132 to the VLR for faster access. However, the VLR of MSC 122 may also assign and store local data, such as temporary identifications. Optionally, the VLR of MSC 122 can be enhanced for more efficient co-ordination of GPRS and non-GPRS services and functionality (e.g. paging for circuit-switched calls which can be performed more efficiently via SGSN 126, and combined GPRS and non-GPRS location updates).

Serving GPRS Support Node (SGSN) 126 is at the same hierarchical level as MSC 122 and keeps track of the individual locations of mobile stations. SGSN 126 also performs security functions and access control. Gateway GPRS Support Node (GGSN) 128 provides interworking with external packet-switched networks and is connected with SGSNs (such as SGSN 126) via an IP-based GPRS backbone network. SGSN 126 performs authentication and cipher setting procedures based on the same algorithms, keys, and criteria as in existing GSM. In conventional operation, cell selection may be performed autonomously by mobile station 102 or by the transceiver equipment instructing mobile station 102 to select a particular cell. Mobile station 102 informs wireless network 104 when it reselects another cell or group of cells, known as a routing area.

In order to access GPRS services, mobile station 102 first makes its presence known to wireless network 104 by performing what is known as a GPRS "attach". This operation establishes a logical link between mobile station 102 and SGSN 126 and makes mobile station 102 available to receive, for example, pages via SGSN, notifications of incoming GPRS data, or SMS messages over GPRS. In order to send and receive GPRS data, mobile station 102 assists in activating the packet data address that it wants to use. This operation makes mobile station 102 known to GGSN 128; interworking with external data networks can thereafter commence. User data may be transferred transparently between mobile station 102 and the external data networks using, for example, encapsulation and tunneling. Data packets are equipped with GPRS-specific protocol information and transferred between mobile station 102 and GGSN 128.

Those skilled in art will appreciate that a wireless network may be connected to other systems, possibly including other networks, not explicitly shown in FIG. 1. A network will normally be transmitting at very least some sort of paging and system information on an ongoing basis, even if there is no actual packet data exchanged. Although the network consists of many parts, these parts all work together to result in certain behaviours at the wireless link.

Figure 2:
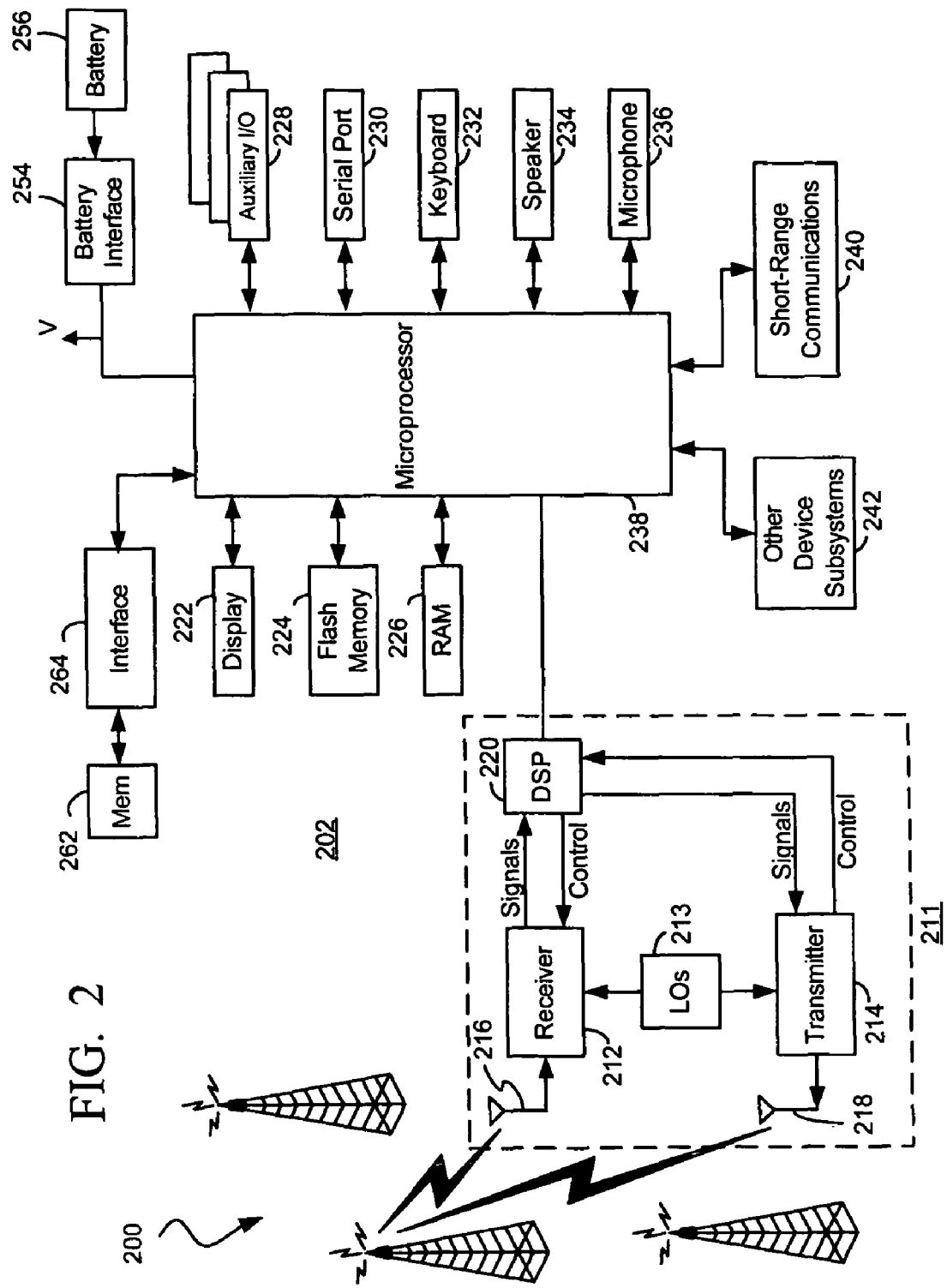
FIG. 2 is a more detailed diagram of a preferred mobile station of FIG. 1.

FIG. 2 is a detailed block diagram of a preferred mobile station 202 of the present application. Mobile station 202 is preferably a two-way communication device having at least voice and advanced data communication capabilities, including the capability to communicate with other computer systems. Depending on the functionality provided by mobile station 202, it may be referred to as a data messaging device, a two-way pager, a cellular telephone with data messaging capabilities, a wireless Internet appliance, or a data communication device (with or without telephony capabilities). Mobile station 202 may communicate with any one of a plurality of fixed transceiver stations 200 within its geographic coverage area.

Mobile station 202 will normally incorporate a communication subsystem 211, which includes a receiver 212, a transmitter 214, and associated components, such as one or more (preferably embedded or internal) antenna elements 216 and 218, local oscillators (LOs) 213, and a processing module such as a digital signal processor (DSP) 220. Communication subsystem 211 is analogous to RF transceiver circuitry 108 and antenna 110 shown in FIG. 1. As will be apparent to those skilled in field of communications, particular design of communication subsystem 211 depends on the communication network in which mobile station 202 is intended to operate.

Mobile station 202 may send and receive communication signals over the network after required network registration or activation procedures have been completed. Signals received by antenna 216 through the network are input to receiver 212, which may perform such common receiver functions as signal amplification, frequency down conversion, filtering, channel selection, and like, and in example shown in FIG. 2, analog-to-digital (A/D) conversion. A/D conversion of a received signal allows more complex communication functions such as demodulation and decoding to be performed in DSP 220. In a similar manner, signals to be transmitted are processed, including modulation and encoding, for example, by DSP 220. These DSP-processed signals are input to transmitter 214 for digital-to-analog (D/A) conversion, frequency up conversion, filtering, amplification and transmission over communication network via antenna 218. DSP 220 not only processes communication signals, but also provides for receiver and transmitter control. For example, the gains applied to communication signals in receiver 212 and transmitter 214 may be adaptively controlled through automatic gain control algorithms implemented in DSP 220.

Network access is associated with a subscriber or user of mobile station 202, and therefore mobile station 202 requires a Subscriber Identity Module or "SIM" card 262 to be inserted in a SIM interface 264 in order to operate in the network. SIM 262 includes those features described in relation to FIG. 1. Mobile station 202 is a battery-powered device so it also includes a battery interface 254 for receiving one or more rechargeable batteries 256. Such a battery 256 provides electrical power to most if not all electrical circuitry in mobile station 202, and battery interface 254 provides for a mechanical and electrical connection for it. The battery interface 254 is coupled to a regulator (not shown) which provides power V+ to all of the circuitry.

Mobile station 202 includes a microprocessor 238 (which is one implementation of controller 106 of FIG. 1) which controls overall operation of mobile station 202. Communication functions, including at least data and voice communications, are performed through communication subsystem 211. Microprocessor 238 also interacts with additional device subsystems such as a display 222, a flash memory 224, a random access memory (RAM) 226, auxiliary input/output (I/O) subsystems 228, a serial port 230, a keyboard 232, a speaker 234, a microphone 236, a short-range communications subsystem 240, and any other device subsystems generally designated at 242. Some of the subsystems shown in FIG. 2 perform communication-related functions, whereas other subsystems may provide "resident" or on-device functions. Notably, some subsystems, such as keyboard 232 and display 222, for example, may be used for both communication-related functions, such as entering a text message for transmission over a communication network, and device-resident functions such as a calculator or task list. Operating system software used by microprocessor 238 is preferably stored in a persistent store such as flash memory 224, which may alternatively be a read-only memory (ROM) or similar storage element (not shown). Those skilled in the art will appreciate that the operating system, specific device applications, or parts thereof, may be temporarily loaded into a volatile store such as RAM 226.

Microprocessor 238, in addition to its operating system functions, preferably enables execution of software applications on mobile station 202. A predetermined set of applications which control basic device operations, including at least data and voice communication applications, as well as a network reestablishment scheme of the present application, will normally be installed on mobile station 202 during its manufacture. A preferred application that may be loaded onto mobile station 202 may be a personal information manager (PIM) application having the ability to organize and manage data items relating to user such as, but not limited to, e-mail, calendar events, voice mails, appointments, and task items. Naturally, one or more memory stores are available on mobile station 202 and SIM 256 to facilitate storage of PIM data items and other information.

The PIM application preferably has the ability to send and receive data items via the wireless network. In a preferred embodiment, PIM data items are seamlessly integrated, synchronized, and updated via the wireless network, with the mobile station user's corresponding data items stored and/or associated with a host computer system thereby creating a mirrored host computer on mobile station 202 with respect to such items. This is especially advantageous where the host computer system is the mobile station user's office computer system. Additional applications may also be loaded onto mobile station 202 through network, an auxiliary I/O subsystem 228, serial port 230, short-range communications subsystem 240, or any other suitable subsystem 242, and installed by a user in RAM 226 or preferably a non-volatile store (not shown) for execution by microprocessor 238. Such flexibility in application installation increases the functionality of mobile station 202 and may provide enhanced on-device functions, communication-related functions, or both. For example, secure communication applications may enable electronic commerce functions and other such financial transactions to be performed using mobile station 202.

In a data communication mode, a received signal such as a text message, an e-mail message, or web page download will be processed by communication subsystem 211 and input to microprocessor 238. Microprocessor 238 will preferably further process the signal for output to display 222 or alternatively to auxiliary I/O device 228. A user of mobile station 202 may also compose data items, such as e-mail messages, for example, using keyboard 232 in conjunction with display 222 and possibly auxiliary I/O device 228. Keyboard 232 is preferably a complete alphanumeric keyboard and/or telephone-type keypad. These composed items may be transmitted over a communication network through communication subsystem 211.

For voice communications, the overall operation of mobile station 202 is substantially similar, except that the received signals would be output to speaker 234 and signals for transmission would be generated by microphone 236. Alternative voice or audio I/O subsystems, such as a voice message recording subsystem, may also be implemented on mobile station 202. Although voice or audio signal output is preferably accomplished primarily through speaker 234, display 222 may also be used to provide an indication of the identity of a calling party, duration of a voice call, or other voice call related information, as some examples.

Serial port 230 in FIG. 2 is normally implemented in a personal digital assistant (PDA)-type communication device for which synchronization with a user's desktop computer is a desirable, albeit optional, component. Serial port 230 enables a user to set preferences through an external device or software application and extends the capabilities of mobile station 202 by providing for information or software downloads to mobile station 202 other than through a wireless communication network. The alternate download path may, for example, be used to load an encryption key onto mobile station 202 through a direct and thus reliable and trusted connection to thereby provide secure device communication.

Short-range communications subsystem 240 of FIG. 2 is an additional optional component which provides for communication between mobile station 202 and different systems or devices, which need not necessarily be similar devices. For example, subsystem 240 may include an infrared device and associated circuits and components, or a Bluetooth™ communication module to provide for communication with similarly-enabled systems and devices. Bluetooth™ is a registered trademark of Bluetooth SIG, Inc.

Figure 3:
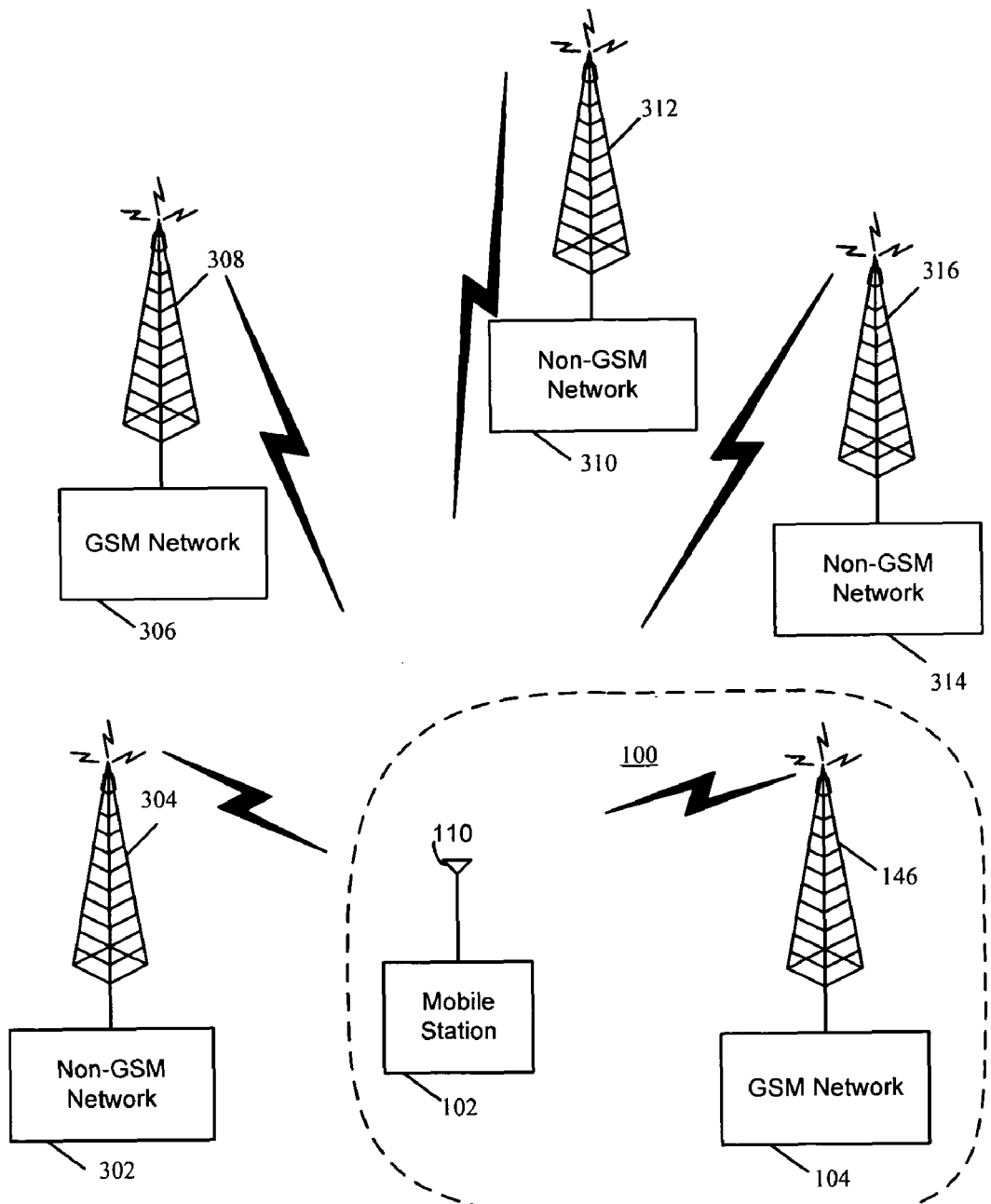
FIG. 3 is a block diagram of a typical communications region where a plurality of wireless communication networks of different types have RF channel assignments in the same RF band.

FIG. 3 is an illustrative example of a geographical region or environment where mobile station 102 and GSM network 104 may be located. In the geographical region of FIG. 3, there exists other networks such as a non-GSM network 302 with an antenna tower 304, a GSM network 306 with an antenna tower 308, a second non-GSM network 310 with an antenna tower 312, and a third non-GSM network 314 with an antenna tower 316. In this illustrative example, the number of non-GSM networks shown is three and the number of GSM networks shown is two. In any geographical region, the number of GSM networks and non-GSM networks may be greater or lesser than that shown in FIG. 3. All of the networks, including both GSM and non-GSM networks, are transmitting RF carrier signals that are received by mobile station 102 (and any other operating mobile units in that geographical region) within the same RF band during the scanning procedure of mobile station 102.

Figure 4:
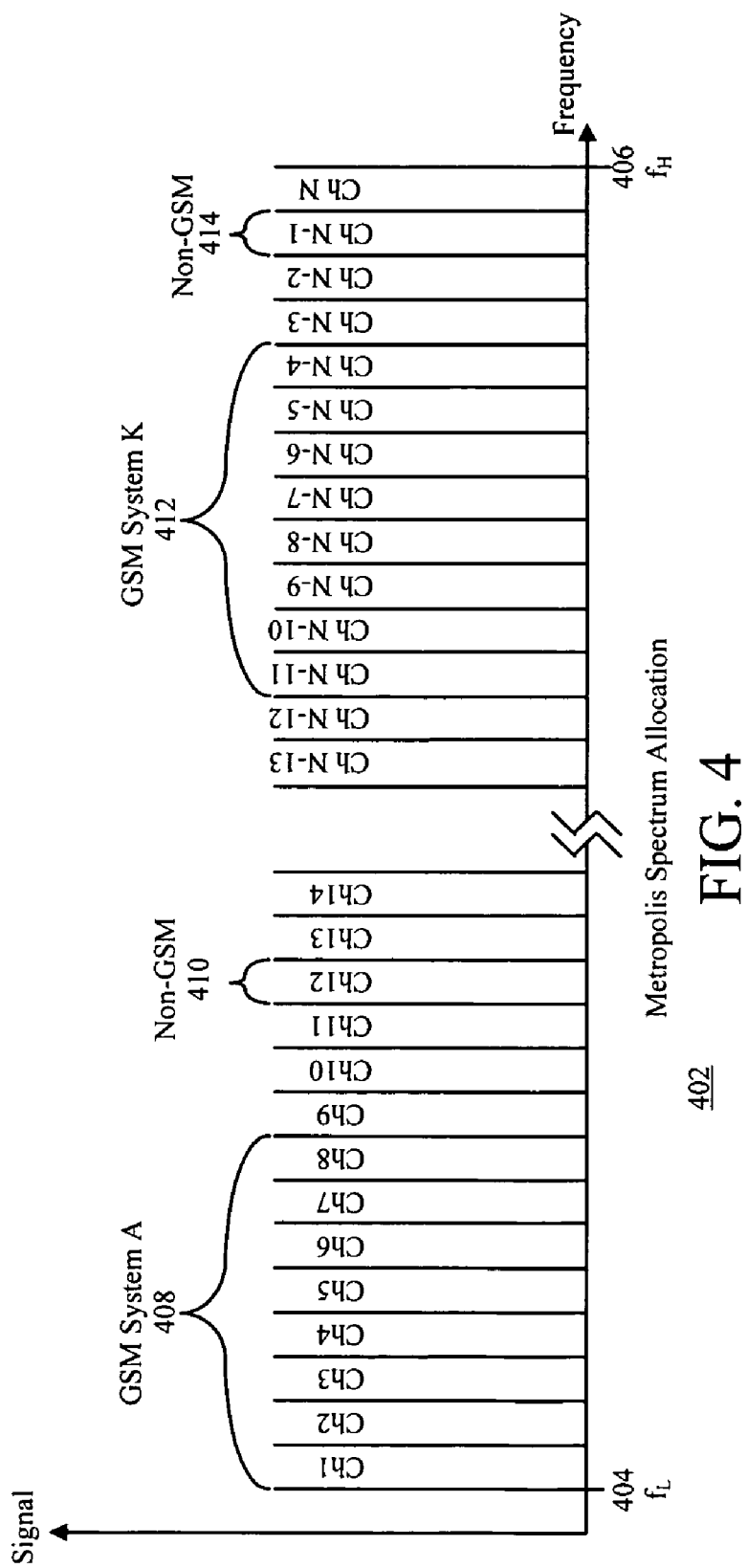
FIG. 4 is a frequency domain graph that shows RF channel assignments of Global System for Mobile Communication (GSM) systems and non-GSM systems as they may be assigned in an illustrative factious region named Metropolis.
Figure 5:
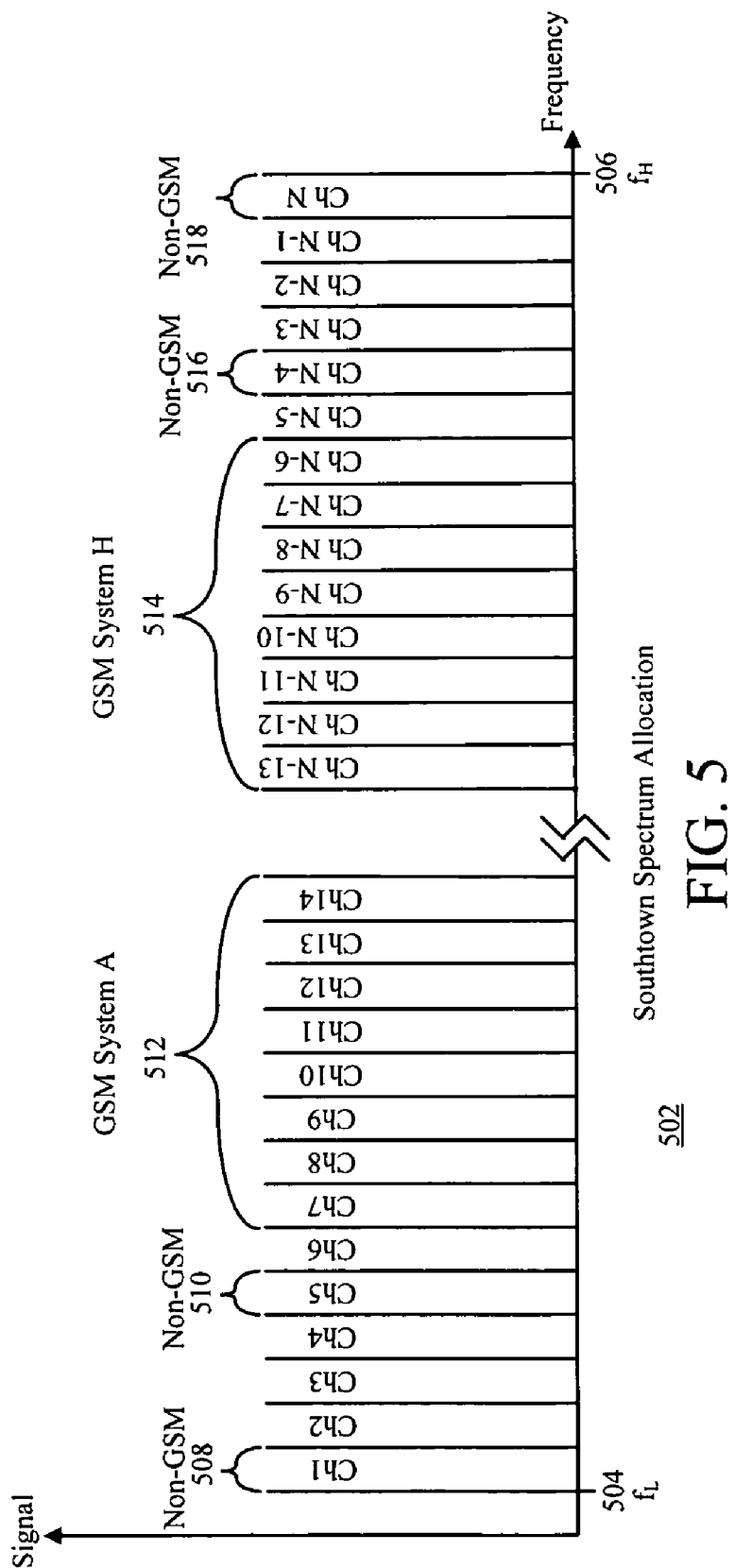
FIG. 5 is a second frequency domain graph that shows RF channel assignments of GSM and non-GSM systems as they may be assigned in another illustrative factious region named Southtown.

FIG. 4 and FIG. 5 are illustrations relating to two fictional regions named Metropolis and Southtown, respectively. These examples are presented to illustrate that the frequency allocations of GSM and non-GSM systems may vary greatly within the RF band from one region to the next as a mobile station is moved from region to region. As apparent, a mobile station is required to perform a scanning procedure to identify GSM-based RF channels as distinguished from non-GSM RF channels in the RF band when operating in a new region.

FIG. 4 is an illustrative example of an RF spectrum allocation graph 402 in the frequency domain for the fictional geographical region named "Metropolis." The frequency range of the graph is from $f_L$ 404 to $f_H$ 406. In the 850 MHz band, $f_L$ would equal 869.2 MHz and $f_H$ would equal 893.8 MHz. The frequency spectrum between $f_L$ and $f_H$ is shown in 25 kHz segments for the purpose of showing the channel allocations in this particular region. Any given region contains N frequency sections that would be equal to $(f_H-f_L)/25$ kHz. In the case of the 869.2-893.8 MHz range, there will be 984 channels which are 25 kHz wide. In this example, a 200 kHz wide GSM System A 408 is shown to occupy channels one through eight; a 25/30 kHz wide non-GSM system 410 is shown to occupy channel twelve; a second 200 kHz wide GSM System K 412 is shown to occupy channels N-11 to N-4; and a second 25/30 kHz wide non-GSM 414 system is shown to occupy channel N-1. For any given region, no more than one channel is assigned to a frequency section.

FIG. 5 is a second illustrative example of an RF spectrum allocation graph 502 for another fictional geographical region named "Southtown." The frequency range of the graph is from $f_L$ 504 to $f_H$ 506. In the 850 MHz band, $f_L$ would be equal 869.2 MHz and $f_H$ would equal 893.8 MHz. The frequency spectrum between $f_L$ and $f_H$ is split into 25 kHz sections for the purpose of showing the assigned channel allocations in this particular region. Any given region contains N frequency sections that would be equal to $(f_H-f_L)/25$ kHz. In this example, a non-GSM system 508 is shown to occupy channel one; a second non-GSM system 510 is shown to occupy channel 5; a GSM system 512 is shown to occupy channels 7 through 14; a second GSM system 514 is shown to occupy channels N-13 to N-6; a third non-GSM system 516 is shown to occupy channel N-4; and a fourth non-GSM system 518 is shown to occupy channel N.

In the RF receiver of the mobile station, a scanning process is utilized for the purpose of detecting each candidate RF carrier signal in the RF band and decoding channel information over the control channels of the available networks. The scanning process obtains channel information from the base station's signal and includes the channel information, along with the RF carrier information, to a channel list for a particular region. The construction of a channel list occurs whenever the mobile station exits one region and enters another region, or when the mobile station is powered on.

In GSM-based systems, information that is decoded over the control channel during the scanning process includes a frequency correction channel (FCCH) burst or signal. The FCCH signal is a frequency correction signal which provides the mobile station with a frequency reference in order to synchronize with the network. Although non-GSM base stations transmit RF signals on RF channels of the "GSM band," non-GSM base stations do not broadcast any FCCH burst. Note that the non-GSM RF signals may in fact be considered as top candidate GSM carrier signals during scanning, as they may have been observed to be oftentimes stronger than GSM RF carrier signals. In any event, the mobile station will ultimately reject the non-GSM RF signal without including the RF channel in the channel list. Note, however, that a FCCH detector of the mobile station requires at least eleven (11) frames (50.8 milliseconds) to reject the non-GSM RF signal due to the recurrence of frequency correction burst information. This is a relatively long time. Per GSM-based standards, a GSM system must be acquired within five (5) seconds. This may be difficult to achieve in the GSM 850 Mhz band unless some special techniques are utilized.

Figure 6:
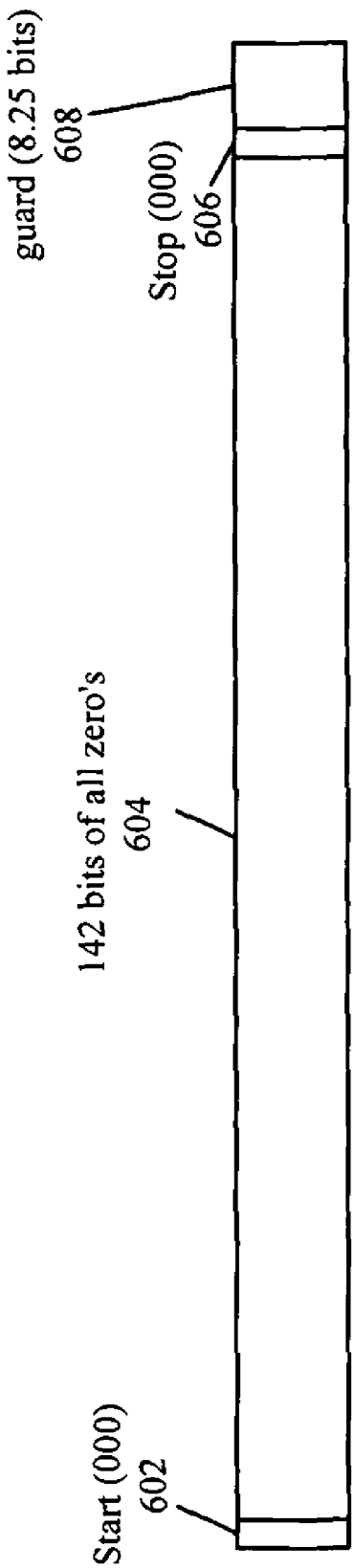
FIG. 6 is bar graph that shows the sequential bit patterns of a frequency control channel (FCCH) burst that are sent from a GSM base station to a GSM mobile station.

FIG. 6 is a bit pattern diagram of a FCCH burst 600 described above. As mentioned, the FCCH signal provides the mobile station with a frequency reference in order to synchronize with the GSM network. The FCCH burst 600 begins with a series of three zero bits named "start" bits 602, followed by 142 bits of all zeros 604, a series, of three zero bits named "stop" bits 606, and a series of 8.25 bits of zeros named "guard" bits 608.

Figure 7:
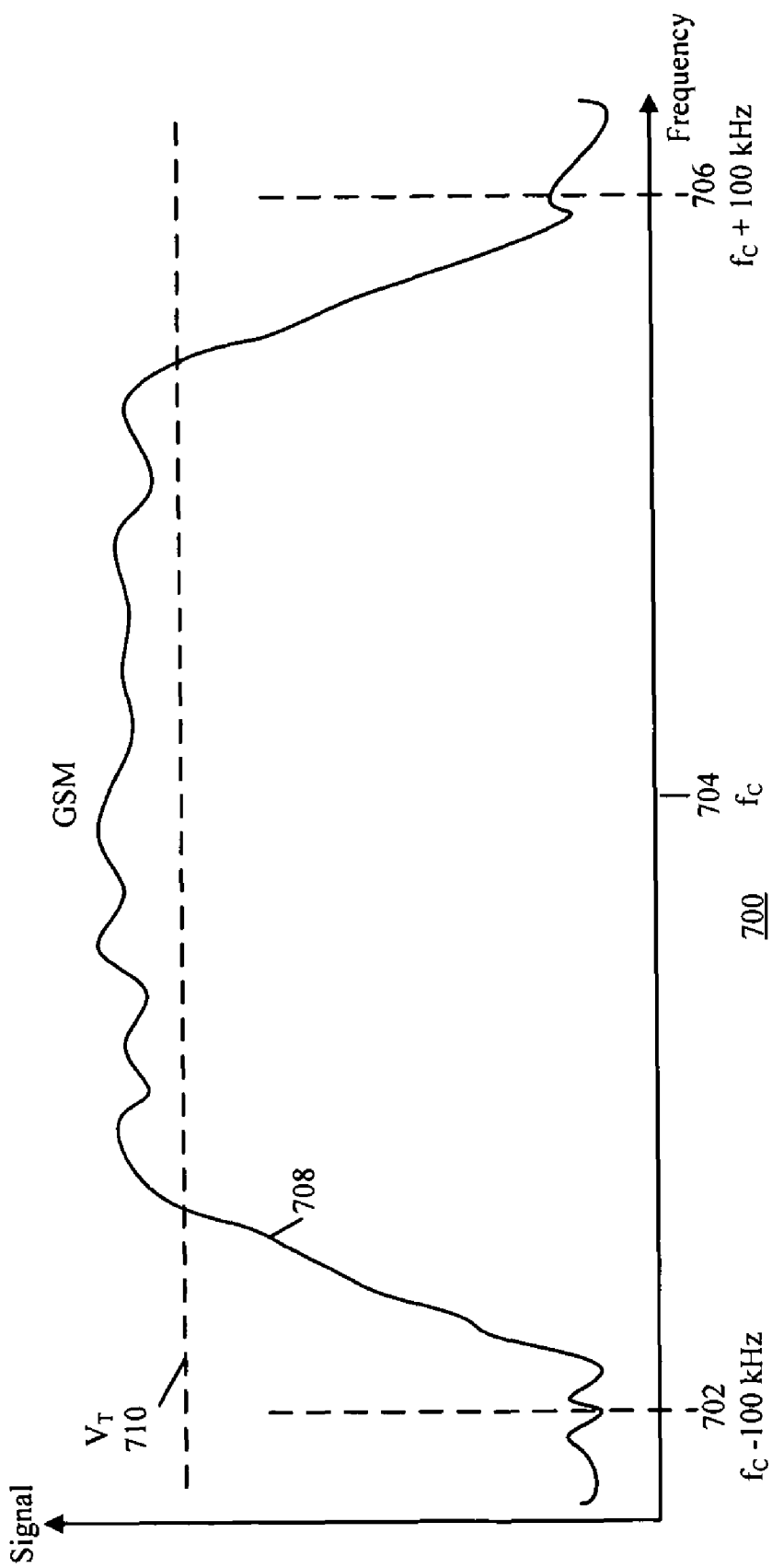
FIG. 7 is a frequency domain graph of a GSM RF carrier signal as transmitted either from a base station or from a mobile station.

FIG. 7 is a graph 700 showing a typical GSM modulated-transmission signal in the frequency domain. In graph 700, a curve 708 depicts a typical GSM signal bandwidth. A frequency marker 702 indicates a lower frequency bandwidth limit of the GSM signal, a frequency marker 704 indicates a center frequency of the GSM signal, and a frequency marker 706 indicates an upper frequency bandwidth limit of the GSM signal. Curve 708 is representative of a GSM signal that would be received by mobile station 102 when center frequency 706 is equal to a center frequency of a GSM network in a particular region. In a GSM-based system, the nominal bandwidth of an RF carrier signal is 200 kHz.

Figure 8:
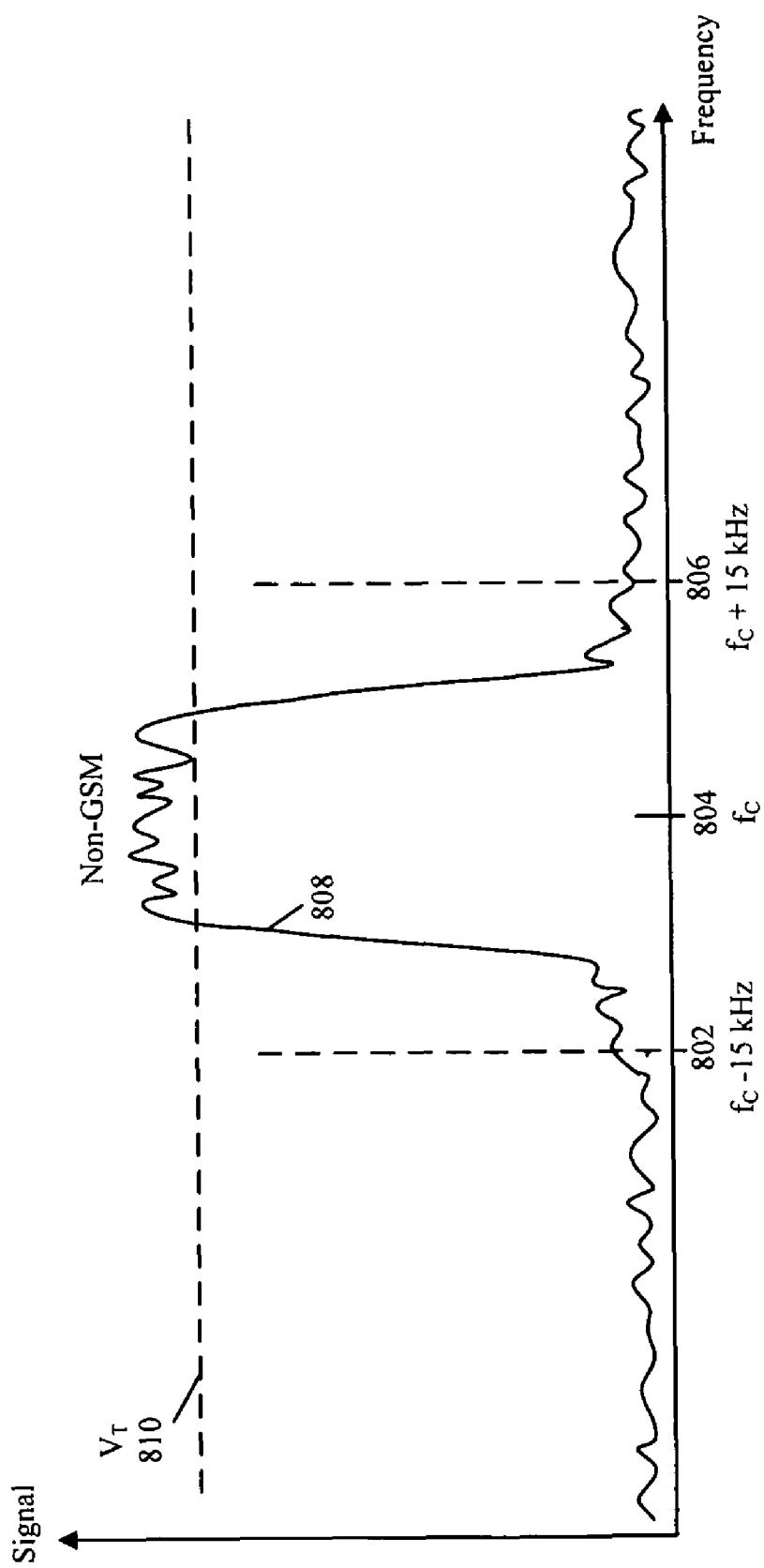
FIG. 8 is a frequency domain graph of a non-GSM RF signal as transmitted either from a base station or from a mobile station.

FIG. 8 is a graph 800 showing a typical non-GSM modulated transmission signal in the frequency domain. In graph 800, a curve 808 depicts a typical non-GSM signal bandwidth. A frequency marker 802 indicates a lower frequency bandwidth limit of the non-GSM signal, a frequency marker 804 indicates a center frequency of the non-GSM signal, and a frequency marker 806 indicates an upper frequency bandwidth limit of the non-GSM signal. Curve 808 is representative of a non-GSM signal that would be received by mobile station 102 when center frequency 806 is equal to a center frequency of a non-GSM network in a particular region. In a non-GSM system, the nominal bandwidth of an RF carrier signal is different from that of the GSM system; a typical nominal bandwidth of an RF carrier signal of the non-GSM system may be as low as 12.5 kHz or no greater than 30 kHz.

As apparent from comparing FIGS. 7 and 8, the bandwidths of GSM signals and non-GSM signals are much different and are indeed discernable from each other. Techniques of the present application are based on this general observation, where RF carrier signals may be expeditiously rejected within the scanning process based on the detected bandwidth of the RF carrier signal.

Figure 9:
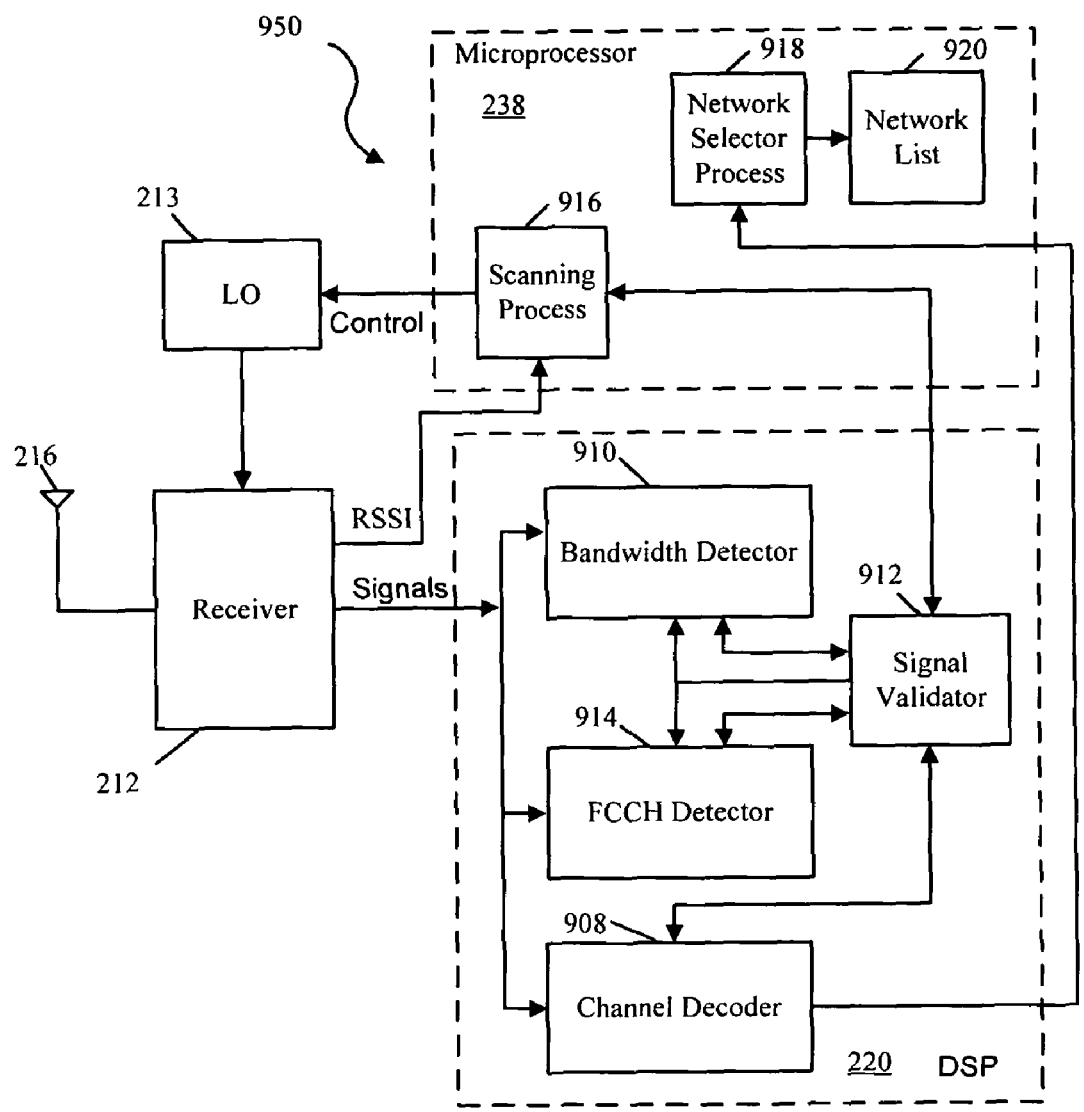
FIG. 9 is a more detailed block diagram of a preferred mobile station of FIG. 1, directed more specifically to circuitry which includes an RF channel scanner and a bandwidth detector for bandwidth validation.

FIG. 9 is a schematic block diagram of pertinent components in the scanning methods and apparatus of the present application. As shown in FIG. 9, several components are the same as those shown and described in relation to FIG. 2 where reference numerals depict like components. Pertinent components of the present application shown in FIG. 9 include an RF channel scanner 950 and a bandwidth detector 910 for bandwidth validation purposes. For scanning purposes, bandwidth detector 910, a FCCH detector 914, and a signal validator 912 are shown as processes in DSP 220, and a scanning process mechanism 916 is shown in microprocessor 238. Together, bandwidth detector 910 and FCCH detector 914 may be referred to as an RF carrier signal validator for the mobile station. For channel information building, DSP 220 includes a channel decoder 908 and microprocessor 238 includes a network selector process 918 and a network list 920 stored in memory.

Antenna 216 delivers radiated energy from a surrounding region to receiver 212. A receiving channel of receiver 212 is determined by a reference RF signal delivered by the microprocessor-controlled LO 213. Scanning process 916 is coupled to and provides proper signaling and control signals to LO 213 so that desired channel reference signals are presented to receiver 212. In response, receiver 212 provides a radio signal strength indicator (RSSI) control line to scanning process 916 within the microprocessor 238. If no RF carrier signal is detected on the RF channel, the RSSI control line will indicate that no RF carrier has been detected and scanning process 916 will cause LO 213 to step to a next reference RF signal in order to monitor the next RF channel of the RF band. When an RF carrier signal is present in receiver 212 with a sufficient signal strength, the RSSI control line will indicate the same and signal validator 912 will operate to validate the RF carrier signal with use of bandwidth detector 910 and FCCH detector 914.

When an RF carrier of sufficient strength is present and a digitized received signal is presented to bandwidth detector 910 and FCCH detector 914, bandwidth detector 910 will determine (e.g. within a few milliseconds) if the RF carrier signal is of the proper bandwidth for the desired GSM communications system. When a non-GSM signal bandwidth is detected by bandwidth detector 910, a control signal issued from bandwidth detector 910 to signal validator 912 causes signal validator 912 to reset FCCH detector 914 and channel decoder 908, as well as to direct scanning mechanism 916 to send new programming information to LO 213 so receiver 212 can monitor the next RF channel within the RF band.

When a valid bandwidth of the RF carrier signal is detected by bandwidth detector 912, FCCH detector 914 continues to monitor the digitized receiver signal to identify any FCCH signal on the RF carrier signal. If the FCCH signal is not detected within a specified time period (e.g. 11 frames (50.8 milliseconds), the RF carrier signal is deemed not a valid RF carrier signal of a GSM network. Thus, a control signal issued from FCCH detector 914 to signal validator 912 causes signal validator 912 to reset bandwidth detector 910 and channel decoder 908, as well as to direct scanning process 916 to send new programming information to LO 213 so that receiver 212 can monitor the next RF channel within the RF band. When the FCCH signal is detected by FCCH detector 914, the mobile station is provided with a frequency reference in order to synchronize with the GSM network. The detection of the FCCH signal is also a further indication and verification that the RF carrier signal is indeed a valid RF carrier signal of the GSM network.

Signal validator 912 is then directed to activate channel decoder 908 to decode control information such as mobile network code (MNC), mobile country code (MCC) and mobile networks information services (MNIS) information from the digitized receiver signal. Such information is stored in a network list 920 for use by a network selector process 918 for selecting the most appropriate GSM-based wireless network for communications with the mobile station. Scanning process 916 may then cause new programming information to be sent to LO 213 so that receiver 212 can monitor the next RF channel within the RF band. Scanning process 916 will continue to scan the RF band until the reference frequency reaches the upper limit of the RF band.

Figure 10:
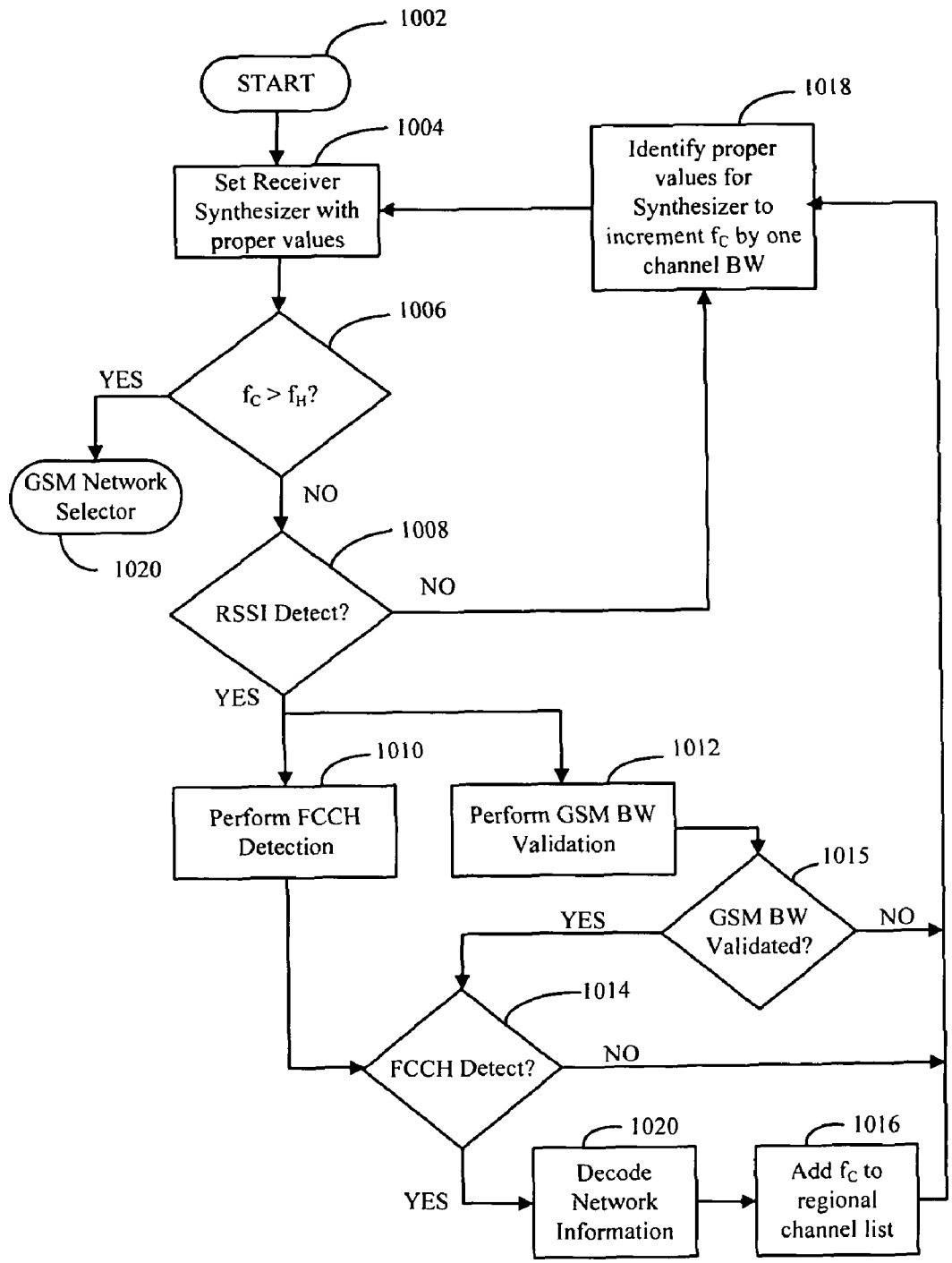
FIG. 10 is a flowchart that shows a process for detecting GSM or non-GSM RF carrier signals with use of a bandwidth detector.

FIG. 10 is a flowchart for describing one illustrative method of scanning an RF band (e.g. 850 MHz band) to validate RF carrier signals of a predetermined wireless communication network (e.g. a GSM-based network). The method may be performed by a mobile station, and/or be embodied in a computer program product which includes a storage medium (e.g. memory) and computer instructions stored in the storage medium which are executable by one or more processors. Broadly, the method includes the steps of monitoring an RF channel to receive a candidate RF carrier signal; identifying whether the candidate RF carrier signal is a valid RF carrier signal of the wireless communication network by estimating a bandwidth of the candidate RF carrier signal and, if the estimated bandwidth is different from a predetermined bandwidth associated with valid RF carrier signals of the wireless communication network, identifying that the candidate RF signal is not a valid RF carrier signal of the wireless communication network; and repeating the acts of monitoring and identifying for a next RF channel of a plurality of RF channels associated with the wireless communication network. Preferably, the RF bandwidth estimating is performed together with a system signal detection process (e.g. FCCH detection). Advantageously, the time required to scan the RF band is reduced.

Beginning at a start block 1002 of FIG. 10, the RF band scanning method is initiated when a synthesizer of the receiver is set to proper values associated with a first RF channel to be scanned (step 1004 of FIG. 10). An RF channel is defined by a predetermined RF carrier signal with a predefined bandwidth. In the case of a GSM network, the RF channel bandwidth is defined as 200 kHz wide. The scanning process will continue through the RF band until all desired channels are monitored within the RF band (as tested in step 1006 of FIG. 10). In step 1006, the current RF channel frequency is indicated by $f_C$ and the maximum channel frequency within the RF band is indicated by $f_H$. In this example, the receiver monitors the lowest RF channel within the RF band (e.g., 869.2 MHz in the 869.2-893.8 MHz band) and continues incrementing the RF channel until it is greater than the maximum RF channel within the RF band (e.g., 893.8 MHz).

If the maximum RF channel has not yet been reached at step 1006, the current RF channel is monitored for the presence of a RF carrier signal having a sufficient signal strength level (step 1008 of FIG. 10). One way that the signal strength level may be identified is by use of a common circuit referred to as a receiver signal strength indicator (RSSI). If no RF carrier signal is detected on the RF channel, the next RF channel is monitored where the synthesizer values are incremented by one channel bandwidth (e.g., 200 kHz for GSM) and set in the synthesizer (step 1018 of FIG. 10).

Note that the signal strength level test in step 1008 of FIG. 10 may be an averaged signal strength level for the RF carrier signal which is based on a plurality of signal strength levels taken over a time period. Typically in GSM, for example, five signal strength levels are taken from a plurality of five scanning operations over a time period of about five seconds; these five signal strength levels are averaged to produce the averaged signal strength level for the RF carrier signal.

If a sufficient RF carrier signal is detected in step 1008, the next steps are those of a parallel process of detecting a FCCH signal (step 1010 of FIG. 10) and validating the candidate RF carrier signal to have a GSM RF signal bandwidth (step 1012 of FIG. 10). If the FCCH detection process in step 1010 fails to detect any FCCH signal within a specified timeframe (as identified in step 1014 of FIG. 10), or the bandwidth validation process in step 1012 fails to validate the candidate RF carrier signal as having the GSM RF signal bandwidth (as identified in step 1015 of FIG. 10), the process aborts any further processing for the current RF channel. In this case, the next RF channel is selected where the synthesizer values are incremented by one channel bandwidth (e.g., 200 kHz for GSM) and set in the synthesizer (step 1018 of FIG. 10). In this case, the process refrains from decoding and saving system and network information associated with the RF carrier signal.

Generally, the GSM bandwidth detection process in steps 1012/1015 may converge on a decision within a few milliseconds (msec), whereas the FCCH detection process in steps 1010/1014 may converge on a decision in about 60 msec. If the GSM bandwidth detection process in steps 1012/1015 indicates that the candidate RF carrier signal is a valid RF carrier signal having the GSM RF signal bandwidth, the FCCH detection process in steps 1010/1014 may still need time to complete. If both the FCCH detection process in steps 1010/1014 and the GSM bandwidth detection process in steps 1012/1015 indicate that the candidate RF carrier signal is a valid RF carrier signal for the GSM system, the process will then decode system and network information (step 1020 of FIG. 10) and save the current RF carrier signal to a regional channel list 1016 along with associated network identification information (step 1016 of FIG. 10). Other system processes may be performed prior to steps 1020 and 1016, such as the processing of the FCCH burst for frequency correction, etc. The entire process will then be repeated again with the selection of the next RF channel where the synthesizer values are incremented by one channel bandwidth (e.g., 200 kHz for GSM) and set in the synthesizer (step 1018 of FIG. 10).

When the maximum RF channel of the RF band has been identified in step 1006 of FIG. 10, then the regional channel list has been completed and a wireless communication network may be selected for communications based on network identification information stored in the list (step 1020 of FIG. 10). Step 1020 may be performed with use of network selector process 918 and network list 920 of FIG. 9, as well as with SIM 256 of FIG. 2 as described earlier herein.

Figure 11:
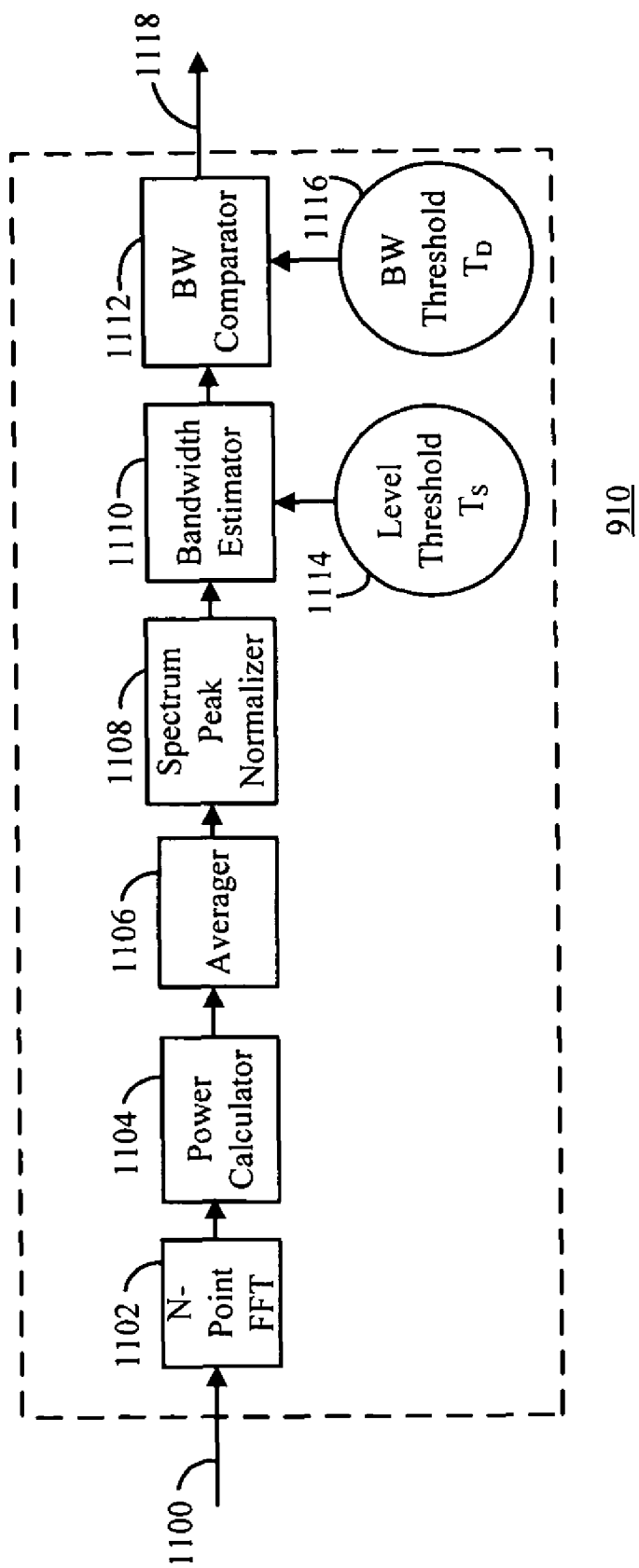
FIG. 11 is a more detailed diagram of a preferred bandwidth detector of FIG. 9.

FIG. 11 is a schematic block diagram of a preferred bandwidth detector 910 which may be utilized in the circuit previously described in relation to FIG. 9. Bandwidth detector 910 is used to estimate a bandwidth of a candidate RF carrier signal within an RF band in order to decide if the candidate RF carrier is an RF carrier signal in a given communications network (e.g. GSM network). A GSM network will have a greater channel bandwidth than that of a paging network, D-AMPS network, or Mobitex network, any or all signals of which may be present within the 850 MHz band (e.g. see FIGS. 7 and 8). GSM networks operate on RF channel bandwidths of approximately 200 kHz, while most non-GSM networks (e.g., paging, D-AMPS, Mobitex, etc.) operate on channel bandwidths no greater than 30 kHz (e.g. again see FIGS. 7 and 8).

As will be described in more detail below in relation to FIG. 11, the RF carrier signal bandwidth is estimated by performing a Fast-Fourier Transform (FFT) process on digitized data which represents the candidate RF carrier signal, to thereby produce a plurality of frequency strength values; estimating a frequency power value from each frequency strength value for producing a plurality of frequency power values which represent at least a portion of the bandwidth of the candidate RF carrier signal; and identifying that the candidate RF carrier signal is not a valid RF carrier signal of the wireless communication network based on the plurality of frequency power values. The plurality of frequency power values may be produced based on averaging and/or normalizing the frequency power values. In a specific approach, each frequency power value that is outside a limit set by a predetermined power threshold value may be counted in order to produce a count value and, if the count value is outside a limit set by a predetermined count value, the candidate RF carrier signal will be deemed not a valid RF carrier signal of the wireless communication network.

Specifically, as shown in FIG. 9, bandwidth detector 910 has an input 1100 coupled to a receiver which provides digitized data representing the candidate RF carrier signal. The digitized data is first processed by an N-point fast Fourier transform (FFT) component 1102 which is adapted to convert this signal from a time-based format into a frequency-based format. Each frequency-based component has an amplitude component, referred to herein as a frequency strength value. The frequency-transformed signal is then processed by a power estimator or calculator 1104 which is adapted to remove any polarity of the amplitude component on each frequency-based component. Power calculator 1104 is given such a name since the process utilizes a squaring function to remove the polarity sign, essentially converting a voltage to a power level as it would be calculated for a unity load.

Once the frequency strength values are converted to frequency power values, the values are fed into an averager 1106 which is adapted to remove any instantaneous anomalies that may occur within any communications system due to signal interference of the likes of power surges within the receiver, environmental noise, and temperature affects. The averaged frequency power values are then processed by a spectrum peak normalizer 1108 which is adapted to remove any excessive peaks within the channel bandwidth that may present an error in the overall bandwidth estimation process. Note that GSM signals have a FCCH burst that could cause an error in the overall bandwidth estimation, since the process uses a normalization calculation based on the level of the RF carrier signal.

After the averaged frequency power values are calculated and normalized, the values are fed into a bandwidth estimator 1110. Bandwidth estimator 1110 has a level threshold $T_S$ input provided with a level threshold $T_S$ 1114 which is used for comparison with each of the averaged frequency power values. For each N-point frequency component, if the averaged frequency power value is greater than the level threshold $T_S$ 1114, a value of one ('1') is assigned to that N-point frequency component. The value of '1' is indicative of sufficient RF signal energy for the given frequency range portion. If the averaged frequency power value is less than the level threshold $T_S$ 1114, a value of zero ('0') is assigned to that N-point component. The value of '0' is indicative of insufficient RF signal energy for the given frequency range portion.

All of the ones and zeros are summed in order to provide a bandwidth count value for the candidate RF carrier signal being monitored by the receiver. A relatively large bandwidth count value is indicative of a relatively large bandwidth for the candidate RF carrier signal, whereas a relatively small bandwidth count value is indicative of a relatively small bandwidth for the candidate RF carrier signal.

The level threshold $T_S$ 1114 may be provided in a programmable or hard-coded memory within the programming of the DSP, or may alternatively be a programmable or hard-wired voltage that is chosen by the user for a given application. In the case of a GSM bandwidth detector, the level threshold $T_S$ 1114 may be chosen so that the programmable level or voltage level correlates to a predetermined level of one-half or one-third of the peak signal, for example. Preferably, the level threshold $T_S$ 1114 is between a peak signal within the candidate RF carrier signal and well above the system noise floor, while still providing some margin for error in the bandwidth detection process.

The bandwidth count value provided at the output of bandwidth estimator 1110 is processed by a bandwidth (BW) comparator 1112. BW comparator 1112 has a bandwidth threshold $T_D$ input which provides a bandwidth threshold $T_D$ 1116 to it. Bandwidth threshold $T_D$ 1116 is predefined so that BW comparator 1112 is adapted to determine if the candidate RF carrier signal has an RF channel bandwidth is that of a GSM-based network (having a channel bandwidth of 200 kHz) or a non-GSM network (having a channel bandwidth of 30 kHz or less). In this application, a relatively large channel bandwidth will result in a higher bandwidth count value given the assignment of a value of one to any averaged power level that is greater than the level threshold $T_S$ and a value of zero assigned to any averaged power level less than the level threshold $T_S$.

The bandwidth threshold $T_D$ may be provided in a programmable or hard-coded memory within the programming of the DSP, or could be a programmable or hard-wired voltage that is chosen by the user for each application. In the case of a GSM bandwidth detector 910, the bandwidth threshold $T_D$ may be chosen so that the programmable level or voltage level correlates to a predetermined bandwidth of 50 kHz, In any case, the bandwidth threshold $T_D$ is chosen to be between a GSM bandwidth of 200 kHz and non-GSM bandwidth of less than 30 kHz, which provides some reasonable margin for error in the bandwidth detection process.

A bandwidth comparator output 1118, which here is the same as the output of bandwidth detector 910, provides an output signal to indicate whether the estimated bandwidth of the candidate RF carrier is greater than or less than the bandwidth defined by the BW threshold $T_D$. The output signal of the bandwidth comparator may be, for example, a logic level one to generally indicate a GSM bandwidth of 200 kHz and a logic level zero to generally indicate a non-GSM bandwidth of less than 30 kHz. If inverted logic is preferred, then the output signal of bandwidth comparator output 1118 may be a zero to generally indicate a GSM bandwidth of 200 kHz and a logic level one to generally indicate a non-GSM bandwidth of less than 30 kHz. The bandwidth detector output 1118 is coupled to some control circuitry within the receiver control circuits, such as a signal validator 912 shown and described earlier in FIG. 9.

Thus, scanning methods and apparatus which utilize a carrier signal bandwidth test have been described. One illustrative method of scanning a radio frequency (RF) band (e.g. 850 MHz band) for valid RF carrier signals of a wireless communication network (e.g. a GSM network) includes the steps of monitoring an RF channel to receive a candidate RF carrier signal; identifying whether the candidate RF carrier signal is a valid RF carrier signal of the wireless communication network by estimating a bandwidth of the candidate RF carrier signal and, if the estimated bandwidth is different from a predetermined bandwidth associated with valid RF carrier signals of the wireless communication network, identifying that the candidate RF signal is not a valid RF carrier signal of the wireless communication network; and repeating the acts of monitoring and identifying for a next RF channel of a plurality of RF channels associated with the wireless communication network. The method may further include the act of detecting whether the candidate RF carrier signal has a predetermined system signal (e.g. a FCCH burst) of the wireless communication network modulated thereon and, if there is a failure in detecting the predetermined system signal modulated on the candidate RF carrier signal, further identifying that the candidate RF signal is not a valid RF carrier signal of the wireless communication network.

If the candidate RF carrier signal is deemed to be a valid RF carrier signal, system information from the valid RF carrier signal which includes a network identification of a wireless communication network may be decoded and saved. If the candidate RF carrier signal is not a valid RF carrier signal of the wireless communication network, the process refrains from decoding and saving any system information from the candidate RF carrier signal. After scanning the RF band, one of a plurality of wireless communication networks is selected for communication based on network identifications decoded from the plurality of wireless communication networks.

In a specific approach, the RF carrier signal bandwidth is estimated by performing a Fast-Fourier Transform (FFT) process on digitized data which represents the candidate RF carrier signal, to thereby produce a plurality of frequency strength values; estimating a frequency power value from each frequency strength value for producing a plurality of frequency power values which represent at least a portion of the bandwidth of the candidate RF carrier signal; and identifying that the candidate RF carrier signal is not a valid RF carrier signal of the wireless communication network based on the plurality of frequency power values. The plurality of frequency power values may be produced based on averaging and/or normalizing the frequency power values. Each frequency power value that is above a predetermined power threshold value may be counted in order to produce a bandwidth count value and, if the count value is below a predetermined count value, the candidate RF carrier signal will be deemed not a valid RF carrier signal of the wireless communication network.

Also as described, a communication device of the present application (e.g. a mobile station) includes a radio frequency (RF) channel scanner and an RF carrier signal validator. The RF channel scanner is adapted to monitor, with use of a wireless transceiver, each one of a plurality of a radio frequency (RF) channels of an RF band of a wireless communication network to identify one or more candidate RF carrier signals. The RF carrier signal validator includes an RF carrier signal bandwidth estimator which is adapted to estimate a bandwidth of each candidate RF carrier signal identified from the RF channel scanner. The RF carrier signal validator is further adapted to identify that the candidate RF carrier signal is not a valid RF carrier signal of the wireless communication network if the estimated bandwidth of the candidate RF carrier signal is different from a predetermined bandwidth associated with valid RF carrier signals of the wireless communication network. The RF carrier signal validator may further include a system signal detector (e.g. FCCH detector) which is adapted to identify a predetermined system signal (e.g. FCCH burst) of the wireless communication network modulated on the candidate RF carrier signal. In this case, the RF carrier signal validator is further adapted to identify that the candidate RF carrier signal is not a valid RF carrier signal of the wireless communication network if there is a failure in identifying the predetermined system signal on the candidate RF carrier signal.

The above-described embodiments of the present application are intended to be examples only. Those of skill in the art may effect alterations, modifications and variations to the particular embodiments without departing from the scope of the application. The invention described herein in the recited claims intends to cover and embrace all suitable changes in technology.

What is claimed is:

1. A method of scanning a radio frequency (RF) band for valid RF carrier signals of a predetermined type of network to produce a channel list of valid RF channels, the method comprising the acts of:
   monitoring an RF channel of the RF band to receive a candidate RF carrier signal;
   estimating a bandwidth of the candidate RF carrier signal;
   determining whether the estimated bandwidth of the candidate RF carrier signal is that of the predetermined type of network;
   if, as identified by the determining, the estimated bandwidth of the candidate RF carrier signal is that of the predetermined type of network, then:
      detecting whether the candidate RF carrier signal has a predetermined system signal modulated thereon;
      if, as identified by the detecting, the candidate RF carrier has the predetermined system signal modulated thereon, then decoding system information on the RF channel, saving the system information, and including the RF channel in the channel list as a valid RF channel;
      if, as identified by the detecting, the candidate RF carrier signal fails to have the predetermined system signal modulated thereon, then refraining from including the RF channel in the channel list as a valid RF channel;
   if, as identified by the determining, the estimated bandwidth is that of a type of network other than the predetermined type of network, then:
      aborting further processing on the RF channel, including omitting the step of detecting whether the candidate RF carrier signal has the predetermined system signal modulated thereon;
      refraining from including the RF channel in the channel list as a valid RF channel; and selecting a next RF channel in the RF band and repeating the acts of monitoring, estimating, and determining, for the next RF channel until the channel list of valid RF channels in the RF band is completed.

2. The method of claim 1,
wherein the predetermined type of network comprises a Global Systems for Mobile communications (GSM) network and the predetermined bandwidth is 200 kHz.

3. The method of claim 1,
wherein the RF band is a 850 MHz band.

4. The method of claim 1,
wherein the act of aborting further processing on the RF channel reduces the time to scan the RF band.

5. The method of claim 1, further comprising:
performing a Fast-Fourier Transform (FFT) process on digitized data which represents the candidate RF carrier signal, to thereby produce a plurality of frequency strength values; and
wherein the act of estimating comprises the further act of estimating a frequency power value from each frequency strength value for producing a plurality of frequency power values which represent at least a portion of the estimated bandwidth.

6. The method of claim 1, further comprising:
performing a Fast-Fourier Transform (FFT) process on digitized data which represents the candidate RF carrier signal, to thereby produce a plurality of frequency strength values;
wherein the act of estimating comprises the further act of estimating a frequency power value from each frequency strength value for producing a plurality of frequency power values which represent at least a portion of the estimated bandwidth; and
wherein the act of determining is based on the plurality of frequency power values.

7. The method of claim 1, further comprising:
performing a Fast-Fourier Transform (FFT) process on digitized data which represents the candidate RF carrier signal for producing a plurality of frequency strength values;
wherein the act of estimating comprises the further acts of estimating a frequency power value from each frequency strength value for producing a plurality of frequency power values and counting each frequency power value that is above a limit set by a predetermined power threshold value for producing a count value; and
wherein the act of identifying that the estimated bandwidth is that of the network other than the predetermined network comprises identifying that the count value is below a limit set by a predetermined count value.

8. The method of claim 1, further comprising:
performing a Fast-Fourier Transform (FFT) process on digitized data which represents the candidate RF carrier signal for producing a plurality of frequency strength values;
wherein the act of estimating comprises the further acts of estimating a frequency power value from each frequency strength value for producing a plurality of frequency power values, performing at least one of averaging and normalizing the frequency power values, and counting each frequency power value that is above a limit set by a predetermined power threshold value for producing a count value; and
wherein the act of identifying that the estimated bandwidth is that of the network other than the predetermined type of network comprises identifying that the count value is below a limit set by a predetermined count value.

9. The method of claim 1, wherein the predetermined system signal comprises a frequency correction signal.

10. The method of claim 1, which is performed by a mobile station operative for GSM communications.

11. The method of claim 1, wherein the act of monitoring comprises monitoring for a candidate RF carrier signal having a sufficient signal strength level, the signal strength level comprising a receiver signal strength indicator (RSSI).

12. A communication device comprising:
a radio frequency (RF) channel scanner configured to monitor, with use of a wireless transceiver, each one of a plurality of RF channels of an RF band to receive one or more candidate RF carrier signals from one or more wireless communication networks for use in producing a channel list of valid RF channels in the RF band;
a bandwidth detector configured to estimate a bandwidth of each said candidate RF carrier signal identified from the RF channel scanner;
a signal validator configured to determine whether the estimated bandwidth of the candidate RF carrier signal is that of a predetermined type of network;
a predetermined system signal detector configured to detect whether the candidate RF carrier signal has a predetermined system signal modulated thereon if the signal validator indicates that the estimated bandwidth of the candidate RF carrier signal is that of the predetermined type of network;
a channel decoder configured to decode system information on the RF channel and save the system information if the predetermined system signal detector detects that the candidate RF carrier has the predetermined system signal modulated thereon, in which case the RF channel is included in the channel list as a valid RF channel;
the predetermined system signal detector further configured to refrain from detecting whether the candidate RF carrier signal has the predetermined system signal modulated thereon if the signal validator indicates that the estimated bandwidth of said candidate RF carrier signal is that of a network other than the predetermined type of network, in which case further processing on the RF channel is aborted and the RF channel is not included in the channel list as a valid RF channel; and
the RF frequency channel scanner being further configured to select a next RF channel in the RF band, so that the monitoring, estimating, and determining are performed for the next RF channel until the channel list of valid RF channels in the RF band is completed.

13. The communication device of claim 12,
wherein the predetermined type of network comprises a Global Systems for Mobile communications (GSM) network and the predetermined bandwidth is 200 kHz.

14. The communication device of claim 12,
wherein the RF band is a 850 MHz band.

15. The communication device of claim 12, further comprising:
a receiver configured to provide a receiver signal strength indicator (RSSI) of the candidate RF carrier signal.

16. The communication device of claim 12,
wherein the predetermined system signal detector comprises a frequency correction signal detector.

17. The communication device of claim 12, wherein the bandwidth detector further comprises:
a Fast-Fourier Transform (FFT) component configured to perform an FFT on digitized data which represents the candidate RF carrier signal, to thereby produce a plurality of frequency strength values; and a power calculator configured to estimate a frequency power value from each frequency strength value for producing a plurality of frequency power values which represent at least a portion of the estimated bandwidth.

18. The communication device of claim 12, further comprising:
wherein the bandwidth detector further comprises:
a Fast-Fourier Transform (FFT) component configured to perform an FFT on digitized data which represents the candidate RF carrier signal, to thereby produce a plurality of frequency strength values;
a power calculator configured to estimate a frequency power value from each frequency strength value for producing a plurality of frequency power values which represent at least a portion of the estimated bandwidth; and
wherein the signal validator is further configured to determine whether the estimated bandwidth is that of the predetermined type of network based on the plurality of frequency power values.

19. The communication device of claim 12, which comprises a mobile station operative for GSM communications.

20. A computer program product, comprising:
a storage medium;
computer instructions stored on the storage medium;
the computer instructions being executable by one or more processors of a communication device for scanning a radio frequency (RF) band for valid RF carrier signals of a predetermined type of network to produce a channel list of valid RF channels in the RF band by:
monitoring an RF channel of the RF band to receive a candidate RF carrier signal;
estimating a bandwidth of the candidate RF carrier signal;
determining whether the estimated bandwidth of the candidate RF carrier signal is that of a predetermined type of network;
if, as identified by the determining, the estimated bandwidth of the candidate RF carrier signal is that of the predetermined type of network, then:
detecting whether the candidate RF carrier signal has a predetermined system signal modulated thereon;
if, as identified by the detecting, the candidate RF carrier has the predetermined system signal modulated thereon, then decoding system information on the RF channel, saving the system information, and including the RF channel in the channel list as a valid RF channel;
if, as identified by the detecting, the candidate RF carrier signal fails to have the predetermined system signal modulated thereon, then refraining from including the RF channel in the channel list as a valid RF channel;
if, as identified by the determining, the estimated bandwidth is that of a network other than the predetermined type of network:
aborting further processing on the RF channel, including omitting the step of detecting whether the candidate RF carrier signal has the predetermined system signal;
refraining from including the RF channel in the channel list as a valid RF channel; and
selecting a next RF channel in the RF band and repeating the acts of monitoring, estimating, and determining, for the next RF channel until the channel list of valid RF channels in the RF band is completed.

21. The computer program product of claim 20, wherein the
predetermined type of network comprises a Global Systems for Mobile communications (GSM) network and predetermined bandwidth is 200 kHz.

22. The computer program product of claim 20, wherein the
RF band is a 850 MHz band.

23. The computer program product of claim 20, wherein the
act of aborting further processing on the RF channel reduces the time to scan the RF band.

24. The computer program product of claim 20, wherein the computer instructions are further executable by the one or more processors for:
performing a Fast-Fourier Transform (FFT) process on digitized data which represents the candidate RF carrier signal, to thereby produce a plurality of frequency strength values; and
wherein the estimating further comprises estimating a frequency power value from each frequency strength value for producing a plurality of frequency power values which represent at least a portion of the estimated bandwidth.

25. The computer program product of claim 20, wherein the computer instructions are further executable by the one or more processors for:
performing a Fast-Fourier Transform (FFT) process on digitized data which represents the candidate RF carrier signal, to thereby produce a plurality of frequency strength values;
wherein the estimating further comprises estimating a frequency power value from each frequency strength value for producing a plurality of frequency power values which represent at least a portion of the estimated bandwidth; and
wherein the determining further comprises determining whether the estimated bandwidth of the candidate RF carrier signal is that of the predetermined type of network based on the plurality of frequency power values.

26. The computer program product of claim 20, wherein the computer instructions are further executable by the one or more processors for:
performing a Fast-Fourier Transform (FFT) process on digitized data which represents the candidate RF carrier signal for producing a plurality of frequency strength values;
wherein the estimating further comprises estimating a frequency power value from each frequency strength value for producing a plurality of frequency power values, and counting each frequency power value that is above a limit set by a predetermined power threshold value for producing a count value; and
wherein identifying that the estimated bandwidth is that of the network other than the predetermined type of network further comprises identifying that the count value is below a limit set by a predetermined count value.

27. The computer program product of claim 20, wherein the computer instructions are further executable by the one or more processors for:
performing a Fast-Fourier Transform (FFT) process on digitized data which represents the candidate RF carrier signal for producing a plurality of frequency strength values;

wherein the estimating further comprises estimating a frequency power value from each frequency strength value for producing a plurality of frequency power values, performing at least one of averaging and normalizing the frequency power values, and counting each frequency power value that is above a limit set by a predetermined power threshold value for producing a count value; and wherein identifying that the estimated bandwidth is that of the network other than the predetermined type of network further comprises identifying that the count value is below a limit set by a predetermined count value.

* * * * *